(12) United States Patent
Adams et al.

(10) Patent No.: US 7,817,481 B2
(45) Date of Patent: Oct. 19, 2010

(54) COLUMN SELECTABLE SELF-BIASING VIRTUAL VOLTAGES FOR SRAM WRITE ASSIST

(75) Inventors: Chad Allen Adams, Byron, MN (US); George M. Braceras, Essex Junction, VT (US); Todd A. Christensen, Rochester, MN (US); Harold Pilo, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 130 days.

(21) Appl. No.: 12/167,300

(22) Filed: Jul. 3, 2008

(65) Prior Publication Data

US 2010/0002495 A1 Jan. 7, 2010

(51) Int. Cl.
*G11C 7/22* (2006.01)
*G11C 11/00* (2006.01)
*G11C 5/14* (2006.01)

(52) U.S. Cl. .................. 365/189.16; 365/154; 365/156; 365/189.09; 365/189.11

(58) Field of Classification Search ............ 365/189.09, 365/189.16
See application file for complete search history.

(56) References Cited

U.S. PATENT DOCUMENTS

| | | | |
|---|---|---|---|
| 6,788,566 B1 | 9/2004 | Bhavnagarwala et al. | |
| 7,079,426 B2 | 7/2006 | Zhang et al. | |
| 7,643,357 B2* | 1/2010 | Braceras et al. | 365/189.09 |
| 2007/0030741 A1* | 2/2007 | Nii et al. | 365/189.11 |
| 2007/0236983 A1* | 10/2007 | Wang et al. | 365/154 |
| 2007/0263447 A1* | 11/2007 | Koike et al. | 365/185.18 |
| 2009/0207675 A1* | 8/2009 | Kengeri et al. | 365/189.14 |
| 2009/0251984 A1* | 10/2009 | Jung et al. | 365/226 |
| 2009/0285039 A1* | 11/2009 | Adams et al. | 365/189.11 |

* cited by examiner

*Primary Examiner*—Son L Mai
(74) *Attorney, Agent, or Firm*—Dillon & Yudell LLP; Robert R. Williams

(57) ABSTRACT

A static random access memory decoder circuit includes a first cell supply line coupled to provide a first column of memory cells a first cell supply voltage and a second cell supply line coupled to provide a first column of memory cells a first cell supply voltage. The decoder circuit further includes a write assist circuit having a first threshold transistor coupled to the first cell supply line and a second threshold transistor coupled to the second cell supply line. In response to a write assist signal, the write assist circuit connects one of the first and second cell supply lines selected by control circuitry to an associated one of the first and second threshold transistors, such that a cell supply voltage of the selected one of the first and second cell supply lines is reduced toward the threshold voltage of the threshold transistor.

14 Claims, 6 Drawing Sheets

US 7,817,481 B2

COLUMN SELECTABLE SELF-BIASING VIRTUAL VOLTAGES FOR SRAM WRITE ASSIST

BACKGROUND OF THE INVENTION

1. Technical Field

The present invention relates in general to the field of static random access memory (SRAM) and in particular to SRAM decoders with write assist.

2. Description of the Related Art

As memory devices such as SRAM achieve increasingly smaller line sizes, normal variations in the devices introduced by the production processes become increasingly significant. Production variations may narrow the effective voltage range of a memory device's centering window, reducing the difference between the voltage required to retain stable data within a memory cell and the voltage required to update the memory cell. The reliability of the memory device can therefore be diminished.

A variety of techniques have been adopted in SRAM design to increase memory stability in the presence of narrowed write window. One technique that has been effective is to apply a lower cell supply voltage during a WRITE operation and a higher cell supply voltage during a READ operation. In order to provide more than one cell supply voltage, an additional power supply circuit may be implemented in the SRAM or a chip reference voltage regulator may be used to generate a lower cell supply voltage for use during WRITE operations. However, adding one or more additional voltage supplies to the SRAM can be cost prohibitive in at least some applications, and use of an on-chip reference voltage regulator is generally not power efficient.

SUMMARY OF THE INVENTION

A static random access memory decoder circuit includes a first cell supply line coupled to provide a first column of memory cells a first cell supply voltage and a second cell supply line coupled to provide a first column of memory cells a first cell supply voltage. The decoder circuit further includes a write assist circuit having a first threshold transistor coupled to the first cell supply line and a second threshold transistor coupled to the second cell supply line. In response to a write assist signal, the write assist circuit connects one of the first and second cell supply lines selected by control circuitry to an associated one of the first and second threshold transistors, such that a cell supply voltage of the selected one of the first and second cell supply lines is reduced toward the threshold voltage of the threshold transistor.

DETAILED DESCRIPTION OF AN ILLUSTRATIVE EMBODIMENT

Figure 1A:
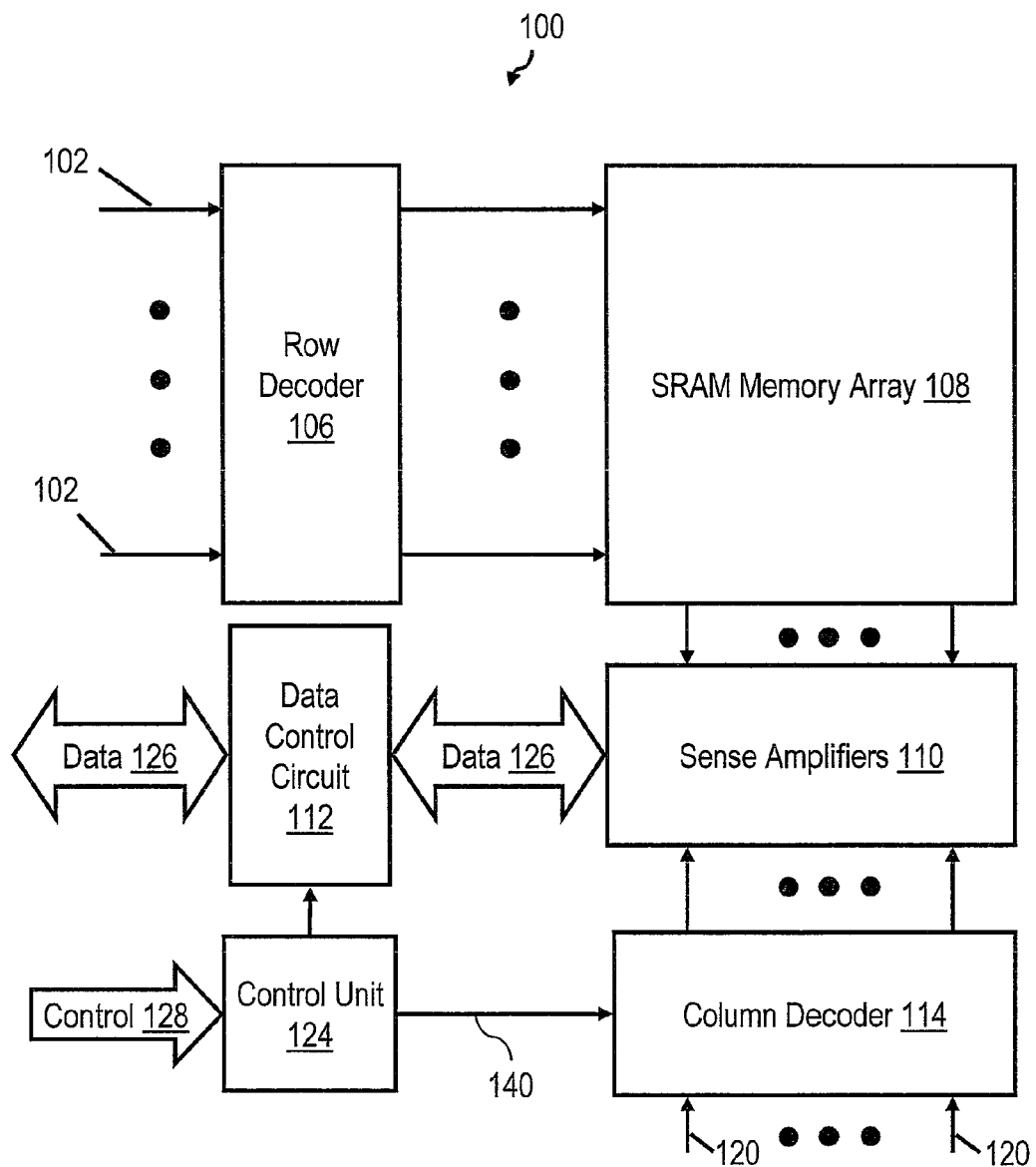
FIG. 1A illustrates a block diagram of a SRAM in accordance with an embodiment of the invention.
Figure 1B:
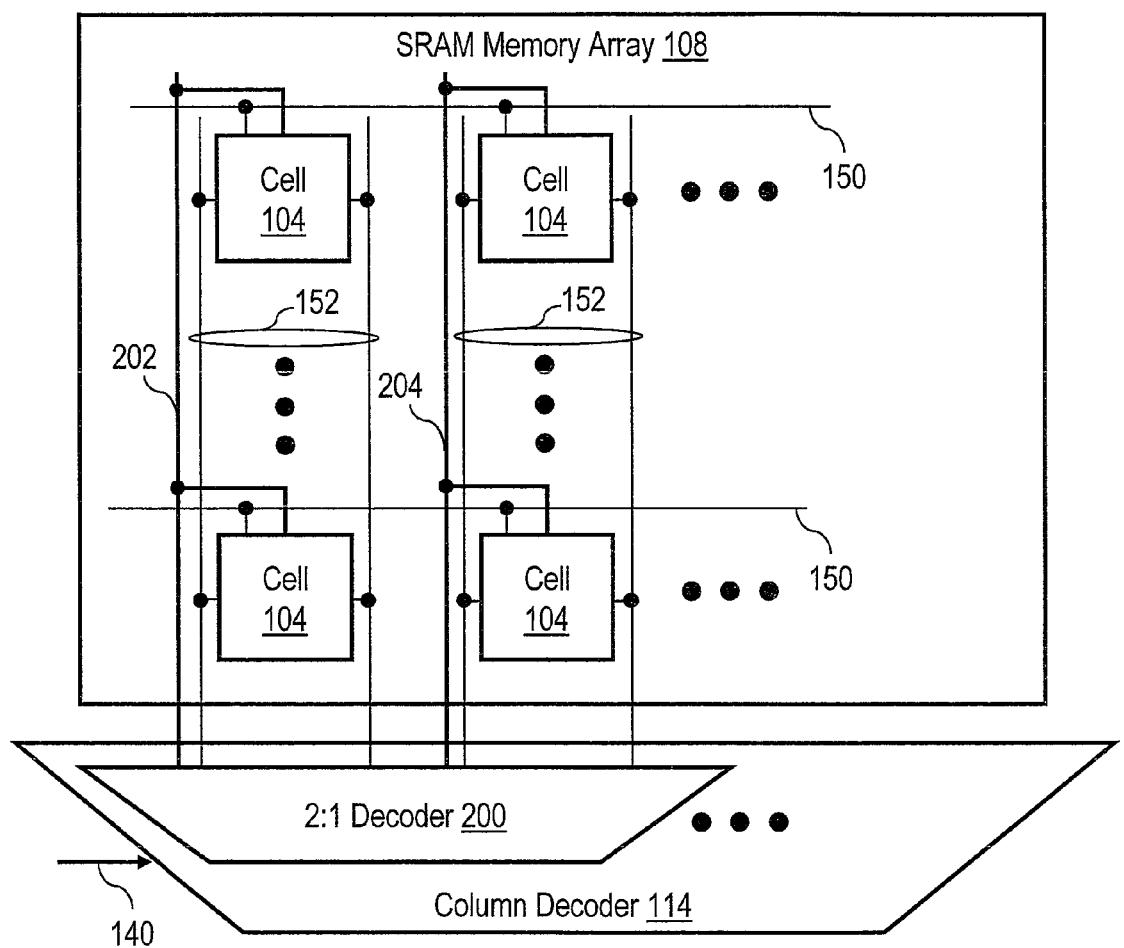
FIG. 1B depicts a more detailed block diagram of an exemplary column decoder for an SRAM in accordance with an embodiment of the invention.

With reference now to the figures and in particular with reference to FIGS. 1A-1B, there are illustrated block diagrams of an exemplary SRAM device 100 in accordance with one embodiment. FIG. 1A is a high level block diagram of the principal circuits of SRAM device 100, and FIG. 1B is a more detailed block diagram of the column decoder of SRAM device 100 in relation to the SRAM memory array.

In the depicted embodiment, SRAM device 100, which is preferably realized as a packaged integrated circuit, includes one or more SRAM memory arrays 108, each containing a plurality of individual SRAM cells 104 each capable of storing a bit of data. SRAM cells 104 may each be implemented, for example, utilizing a 6 T or 4 T cell, as is known in the art. The number of SRAM memory arrays 108 within SRAM 100 is determined, for example, by the desired total size of the memory, the speed at which the memory must operate, layout and testing requirements, and the number of data I/Os on the chip. As best seen in FIG. 1B, in a typical implementation each SRAM memory array 108 is physically arranged in a rectangular (or square) array containing multiple rows and multiple columns, coupled to wordlines 150 and complementary bitline pairs 152, respectively. Each memory cell has a unique location or address defined by the intersection of a wordline 150 and a complementary bitline pair 152, and each address is linked to a particular data input/output pin.

Individual SRAM cells 104 within SRAM cell array 108 can be randomly accessed by supplying the appropriate combinations of row and column address bits to row address lines 102 and column address lines 120, respectively. Row decoder 106 decodes the row address bits applied to row address lines 102 to assert the appropriate wordlines within SRAM memory array 108, and column decoder 114 decodes the column address bits applied to column address lines 120 to select a column of cells 104 to be accessed from among the columns in SRAM memory array 108. As shown in FIG. 1B, column decoder 114 may employ column interleaving, meaning that multiple columns share a single sense amplifier and write driver. For example, in the depicted embodiment, column decoder 114 employs 2:1 interleaving and therefore includes a 2:1 decoder 200 for each pair of columns in SRAM memory array 108. Sense amplifiers 110 connected to SRAM memory array 108 sense and amplify bit values accessed in SRAM memory array 108 in accordance with the outputs of row decoder 106 and column decoder 114.

SRAM device 100 can be accessed in one or more types of READ and WRITE cycles, as specified by control signals 128 supplied to a control unit 124. In response to control signals 128, control unit 124 controls the operation of data control circuit 112 in accordance with the desired type of memory access. For example, during a READ cycle, control unit 124 signals data control circuit 112 to receive and output data 126 detected by sense amplifiers 110. Alternatively, during a WRITE access to SRAM device 100, control unit 124 signals data control circuit 112 to receive data 126 and input data 126 into selected bit locations in SRAM memory array 108 via sense amplifiers 110. In addition, if write-assist is desired (e.g., as specified by a mode setting of SRAM device 100) during the WRITE cycle, control unit 124 asserts a WRTAST (write assist) signal on decoder control line 140.

Figure 2:
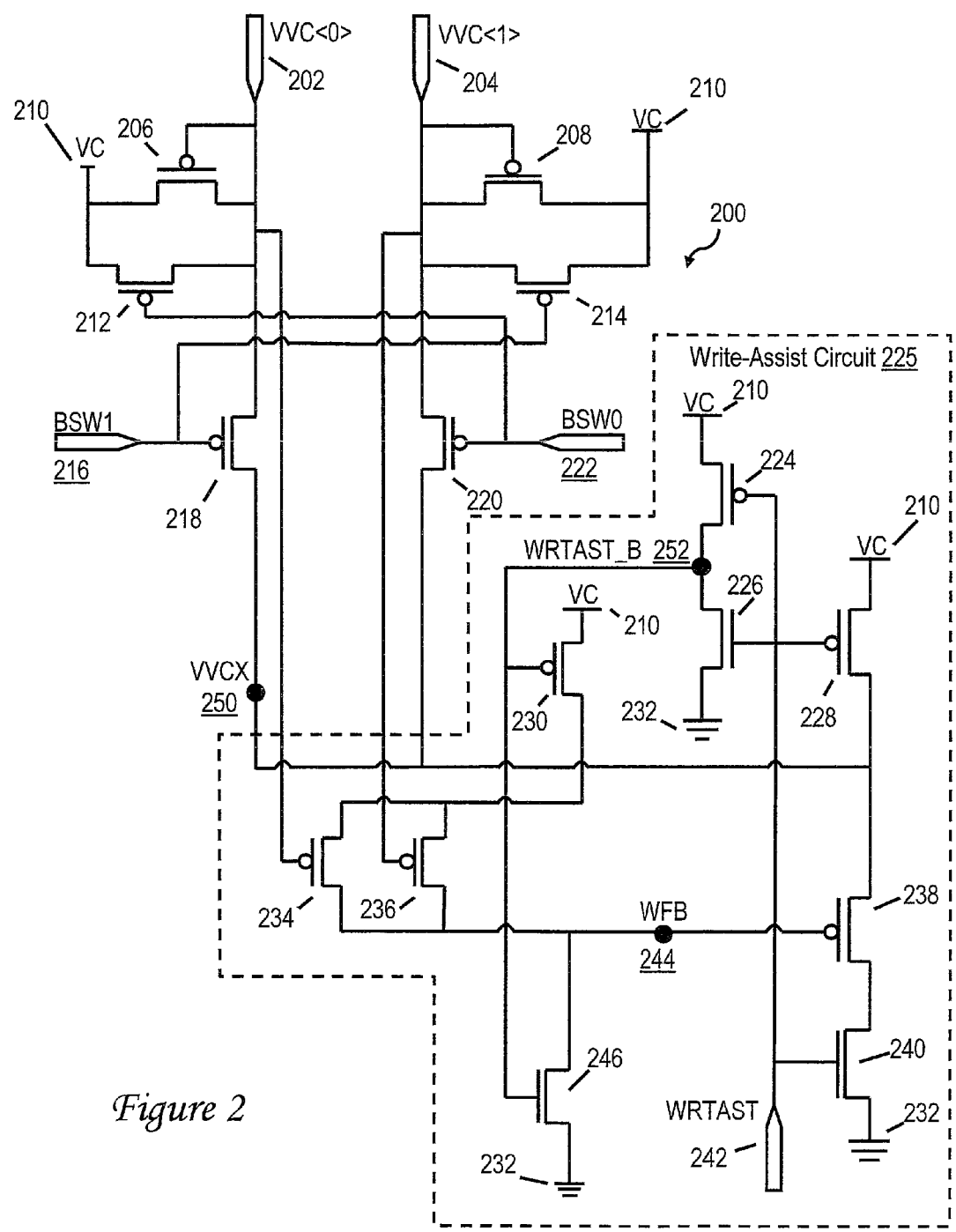
FIG. 2 illustrates a circuit schematic of a two-column decoder for an SRAM that includes a write assist circuit in accordance with an embodiment of the invention.

Referring now additionally to FIG. 2, there is illustrated a more detailed circuit diagram of an exemplary SRAM two-column decoder 200 within column decoder 114 in accordance with one embodiment. In the depicted embodiment, a first cell supply line 202 provides a voltage (VVC<0>) to a first column of cells in an SRAM memory array 108 (see FIG. 1B). Within two-column decoder 200, the first cell supply line 202 is connected through parallel positive channel field effect transistor (PFETs) 206 and 212 to supply voltage VC 210. The gate of PFET 206 is connected to first cell supply line 202, and the gate of PFET 212 is connected to a first control line (BSW0) 222. A second control line (BSW1) 216 is connected to the gate of a first control PFET 218. First control PFET 218 connects the first cell supply line 202 to node VVCX 250.

A corresponding circuit is implemented for a second cell supply line 204 providing a voltage (VVC<1>) to a second column of cells in an SRAM memory array 108 (see FIG. 1B). In particular, second cell supply line 204 is connected through parallel PFETs 208 and 214 to supply voltage VC 210. The gate of PFET 208 is connected to second cell supply line 204. The gate of PFET 214 is connected to a second control line (BSW1) 216. First control line 222 is connected to the gate of a second control PFET 220, which connects second cell supply line 204 to node VVCX 250.

The foregoing circuitry is coupled to a write-assist circuit 225. In particular, first cell supply line 202 is further connected to the gate of first threshold PFET 234, and second cell supply line 204 is further connected to the gate of second threshold PFET 236. Threshold PFETs 234 and 236 are connected in parallel between PFET 230 and negative channel field effect transistor (NFET) 246. The source of PFET 230 is connected to supply voltage VC 210, and the drain of NFET 246 is connected to ground (GND) 232.

A write-assist (WRTAST) line 242, which receives the WRTAST signal from decoder control line 140, is connected to the gates of PFET 224 and NFET 226, which together form an inverter, as well as to the gates of PFET 228 and NFET 240. PFET 224 is connected between supply voltage 210 and inverse-write-assist WRTAST_B node 252. NFET 226 is connected between WRTAST_B node 252 and GND 232. The inverse-write-assist WRTAST_B node 252 is connected to the gates of PFET 230 and NFET 246.

PFET 228 is connected between supply voltage VC 210 and discharge PFET 238. Discharge PFET 238 is connected between PFET 228 and NFET 240. The gate of discharge PFET 238 is connected to node WFB 244 between threshold PFETs 234 and 236 and NFET 246. NFET 240 is connected between discharge PFET 238 and GND 232.

When the two-column SRAM decoder 200 is not in a write state, either for stand-by or READ, the signals applied to write-assist line 242 and first and second control lines 216 and 222 are LOW, connecting cell supply lines 202 and 204 to supply voltage VC 210 through PFETs 212 and 214. When the write-assist line 242 is LOW, inverse-write-assist node 252 is HIGH as PFET 224 is enabled and NFET 226 is disabled. Node WFB 244 is also LOW as the inverse write-assist node 252 enables NFET 246, connecting node WFB 244 to GND 232.

When the signal applied to write-assist line 242 is HIGH, signifying a need to provide write assist during a WRITE cycle, one of the memory cell columns is selected for writing by applying a HIGH signal to one of first and second control lines 216 or 222. For example, the column of memory cells connected to first cell supply line 202 is selected by applying a HIGH signal to first control line 222 and a LOW signal to second control line 216, and the column of memory cells connected to second cell supply line 204 is selected by applying a HIGH signal to second control line 216 and a LOW signal to first control line 222.

With first control line 222 at a logic HIGH state, control PFET 220 is disabled, isolating second cell supply line 204 from node VVCX 250. PFET 212 is also disabled so that it no longer acts as a pull-up device for first cell supply line 202. With a LOW signal applied to second control line 216, second cell supply line 204 is connected to supply voltage VC 210 through control PFET 214 and PFET 236 is disabled. The first cell supply line 202 is connected to node VVCX 250 through first control PFET 218.

When the signal WRTAST applied to the write-assist line 242 is HIGH, inverse-write-assist node 252 is LOW, being connected to GND 232 by NFET 226. In addition, PFET 230 is enabled. NFET 240 is enabled, providing a connection to GND 232. Initially, discharge PFET 238 is enabled, first threshold PFET 234 is disabled and the first cell supply line 202 is HIGH. When discharge PFET 238 is enabled, node VVCX 250 is discharged until the voltage VVC<0> on the first cell supply line 202 falls below the threshold voltage of first threshold PFET 234.

When the voltage VVC<0> on first cell supply line 202 reaches the threshold voltage of first threshold PFET 234, first threshold PFET 234 is enabled pulling node WFB 244 HIGH, disabling ground PFET 238 and terminating the connection to GND 232 for the remainder of the WRITE cycle. This sets the voltage VVC<0> of the first cell supply line 202 equal to the threshold voltage of first threshold PFET 234 during the WRITE cycle.

PFETs 206 and 208 provide overshoot protection for the cell supply lines 202 and 204. When the voltage on the first cell supply line 202 falls below the threshold voltage of PFET 206, PFET 206 is enabled, connecting the first cell supply line 202 to supply voltage VC 210. When the voltage VVC<1> on the second cell supply line 204 falls below the threshold voltage of PFET 208, PFET 208 is enabled, connecting the second cell supply line 204 to supply voltage VC 210. By enabling both control lines BSW0 222 and BSW1 216 simultaneously, the write-assist decoder circuit 200 can reduce the supply voltage VC 210 to the threshold voltages of PFET 206 and PFET 208.

As control line BSW0 222 and write-assist line 242 go from LOW to HIGH, the voltage VVC<0> at the first cell supply line 202 is significantly reduced until the voltage at node WFB 244 increases to HIGH.

A BIT WRITE function may selectively write only certain bits by controlling the signal WRTAST on the write-assist line 242 on a bit-by-bit basis. When a specified bit will not be written, the write-assist line 242 may be held LOW, holding the selected cell supply line, such as first cell supply line 202, to supply voltage VC 210 through PFET 228 effectively disabling the WRITE for that bit.

Figure 3:
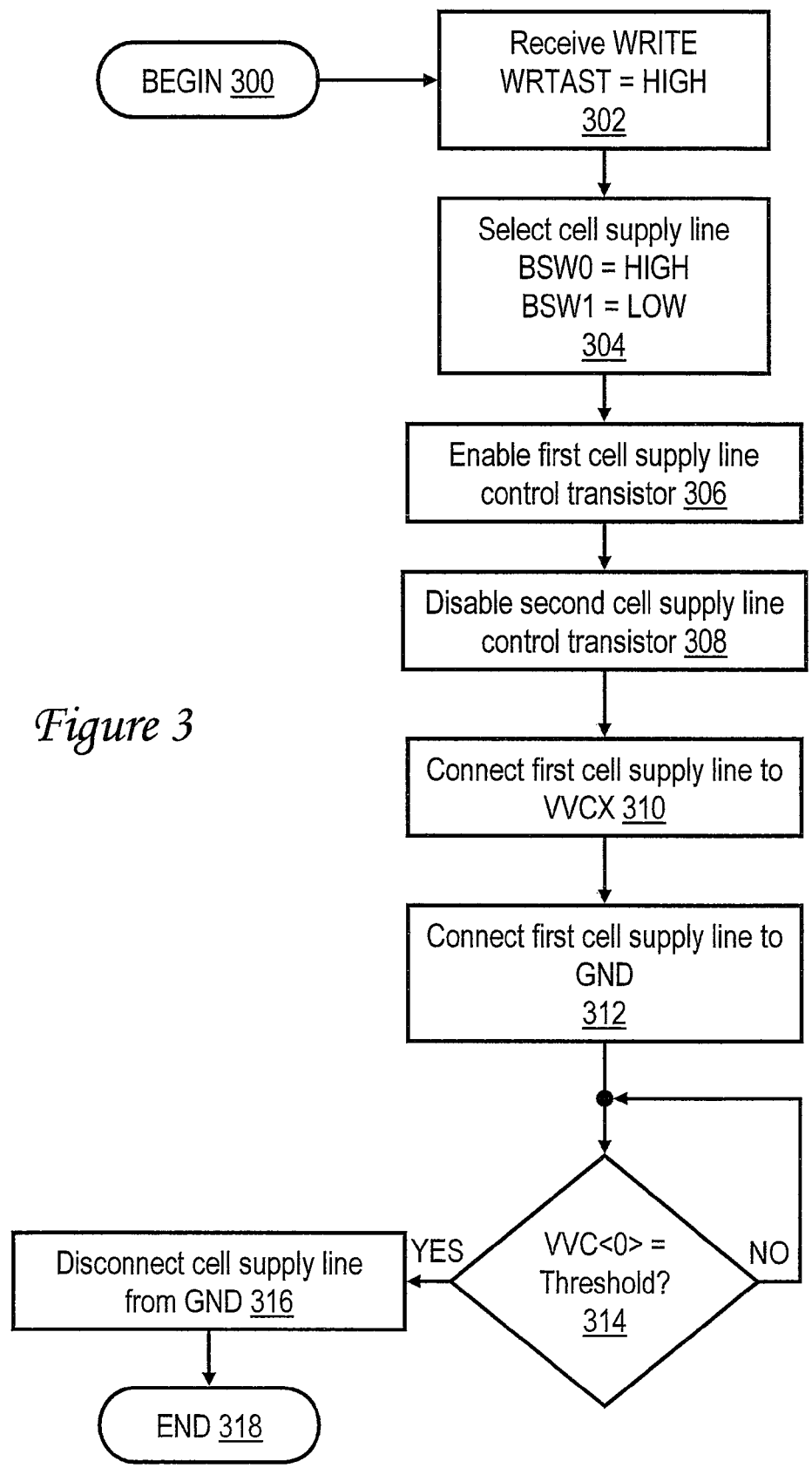
FIG. 3 depicts a flowchart of a write assist process in accordance with an embodiment of the invention.

With reference now to FIG. 3, a flowchart depicts a write-assist process in a memory device, such as an SRAM, during a WRITE operation in accordance with an embodiment of the invention. The process begins at process block 300 with first and second control lines 216, 222 and WRTAST line 242 all LOW. The process then proceeds to block 302, which illustrates column decoder 114 receiving an indication of a WRITE access to SRAM memory array 108 via the assertion of WRTAST signal on decoder control line 140. Column decoder 114 in turn asserts a WRTAST signal on write-assist signal line 242 of two-column decoder 200. As further shown at block 304, column decoder 114 also receives a column address 120 that selects one of the columns to which two-column decoder 200 is connected. For example, in the exemplary operating scenario shown in FIG. 3, BSW0 222 is asserted or HIGH, and BSW1 216 (and all other like column control signals) is deasserted or LOW. As discussed above, deassertion of BSW1 216 and assertion of BSW0 222 disables pull-up to VC by PFET 212 and enables first control PFET 218 (block 306), which connects the first cell supply line 202 to node VVCX 250 (block 310). Deassertion of BSW1 216 disables second control PFET 220 (block 308).

As noted above, ground PFET 238 is disabled when first threshold PFET 234 is enabled and the first cell supply line 202 is HIGH. When ground PFET 238 is enabled, node VVCX 250 is connected to GND 232 (block 312), thus reducing the voltage of first cell supply line 202. As indicated by decision block 314, first cell supply line 202 remains connected to GND via threshold PFET 238 until VVC<0> reaches a threshold value (i.e., the threshold voltage of first threshold PFET 234). When the voltage VVC<0> of first cell supply line 202 reaches the threshold value, first cell supply line 202 is disconnected from GND, as shown at block 316. The write-assist process depicted in FIG. 3 ends at process block 318.

Figure 4:
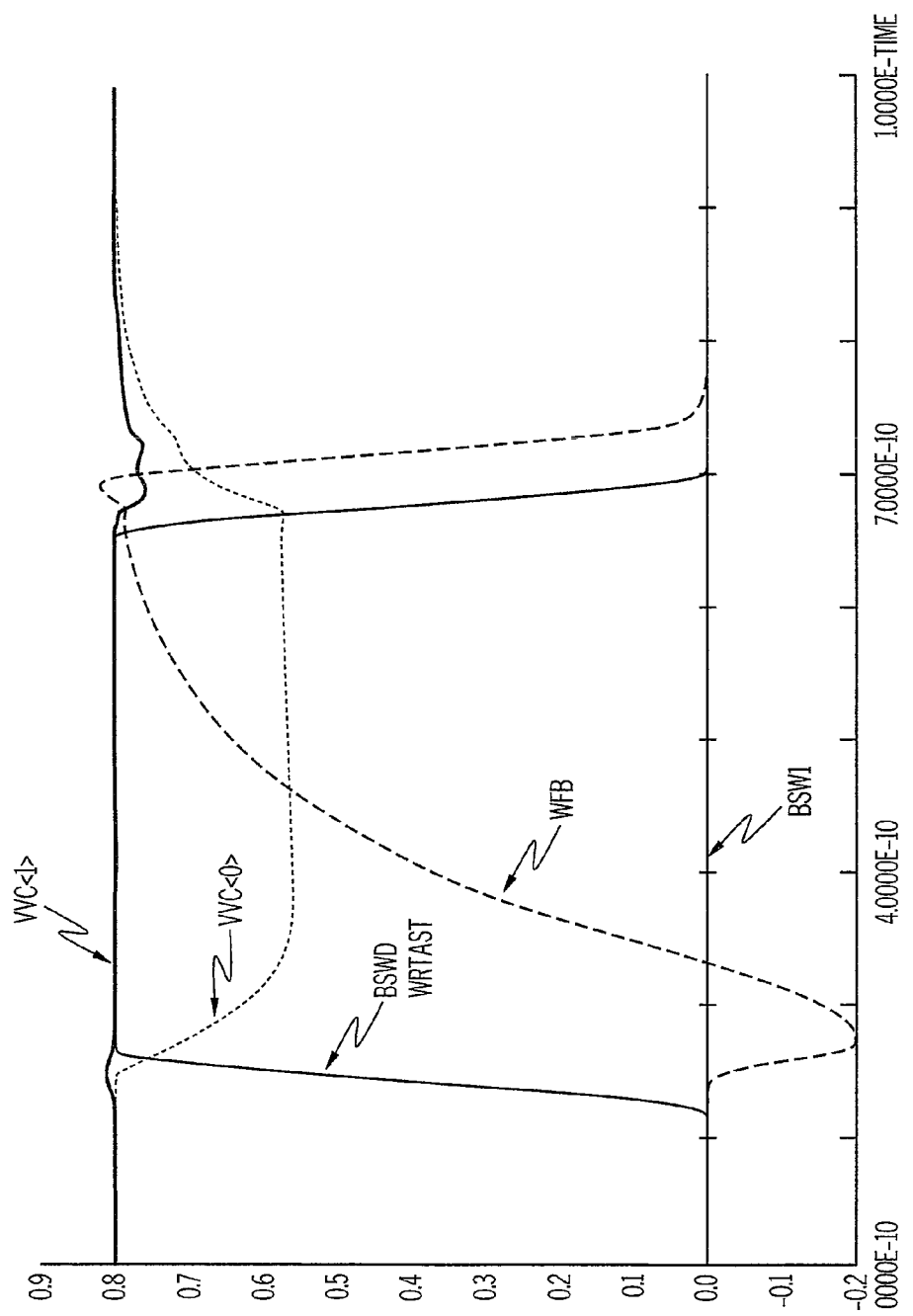
FIG. 4 depicts a graph of voltages over time during a WRITE cycle, in accordance with an embodiment of the invention.

With reference to FIG. 4, a timing diagram depicting variations of voltages during a WRITE cycle, in accordance with the embodiment depicted in FIG. 2. As the WRITE cycle begins, first and second cell supply voltages VVC<0> and VVC<1> of cell supply lines 202 and 204, respectively, are held at the supply voltage VC 210. In response to selection of the first column of cells, first control signal BSW0 222 goes HIGH, and second control signal BSW1 216 stays LOW. In response to assertion of the WRTAST signal, write-assist line 242 also goes HIGH pulling the cell supply voltage VVC<0> 202 down to a threshold voltage (e.g., the threshold voltage of first threshold PFET 234) to provide write-assist. As the WRITE cycle progresses, the voltage at node WFB 244 rises to HIGH. When the WRITE cycle ends, first control signal BSW0 222 and write-assist line 242 go LOW, cell supply voltage VVC<0> 202 rises to HIGH, and the voltage at WFB node 244 node drops to LOW.

Figure 5:
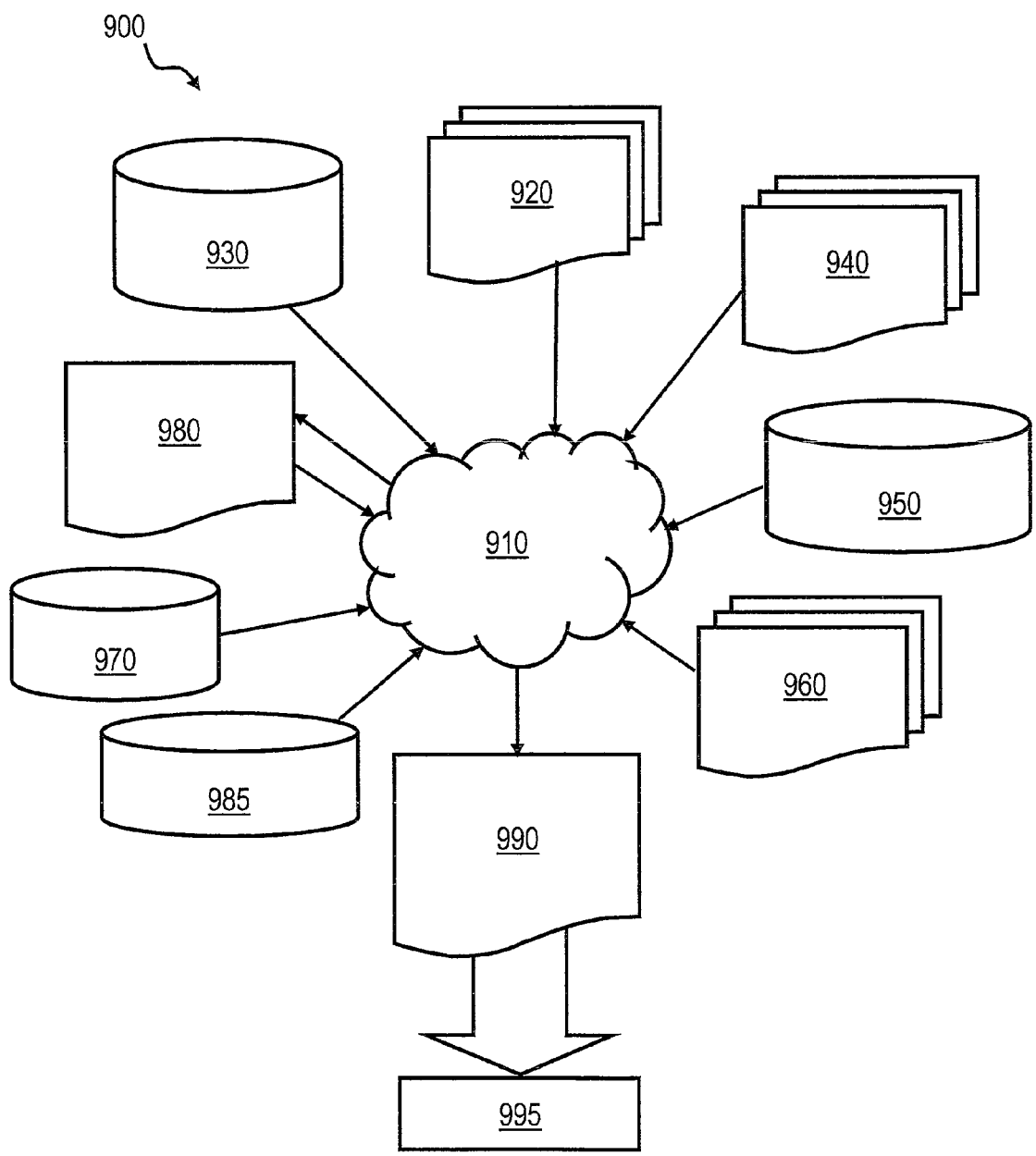
FIG. 5 is a high level view of a design process in accordance with an embodiment of the invention.

Referring now to FIG. 5, there is depicted a block diagram of an exemplary design flow 900 used for example, in semiconductor IC logic design, simulation, test, layout, and manufacture. Design flow 900 includes processes and mechanisms for processing design structures to generate logically or otherwise functionally equivalent representations of the embodiments of the invention shown in FIGS. 1A, 1B and 2. The design structures processed and/or generated by design flow 900 may be encoded on machine-readable transmission or storage media to include data and/or instructions that when executed or otherwise processed on a data processing system generate a logically, structurally, or otherwise functionally equivalent representation of hardware components, circuits, devices, or systems.

FIG. 5 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1A, 1B and 2. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1A, 1B and 2 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium. The medium may be a non-volatile storage medium such as a magnetic or optical disk drive, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include modules for performing standard circuit design processes such as timing analysis, verification, design rule checking, place and route operations, etc.

Design process 910 employs and incorporates well-known logic and physical design tools such as HDL compilers and simulation model build tools to process design structure 920 together with some or all of the depicted supporting data structures to generate a second design structure 990. Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1A, 1B and 2. In one embodiment, design structure 990 may comprise a compiled, executable HDL simulation model that functionally simulates the devices shown in FIGS. 1A, 1B and 2.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data processed by semiconductor manufacturing tools to fabricate embodiments of the invention as shown in FIGS. 1A, 1B and 2. Design structure 990 may then proceed to a stage 995 where, for example, design structure 990: proceeds to tape-out, is released to manufacturing, is released to a mask house, is sent to another design house, is sent back to the customer, etc.

While the invention has been particularly shown and described with reference to a preferred embodiment, it will be understood by those skilled in the art that various changes in form and detail may be made therein without departing from the spirit and scope of the invention. For example, while one illustrative embodiment of an SRAM including a two-column decoder has been described, it will be understood by those skilled in the art that no limitation as to the decoder size is intended and that other embodiments, such as four, eight, or sixteen column decoders, etc., are embraced by the present invention.

What is claimed is:

1. A static random access memory decoder circuit comprising:
   a first cell supply line coupled to a first column of memory cells;
   a second cell supply line coupled to a second column column of memory cells;
   a write assist circuit including a first threshold transistor coupled to the first cell supply line and a second threshold transistor coupled to the second cell supply line, wherein the first threshold transistor has a first threshold voltage level and the second threshold transistor has a second threshold voltage level, wherein in response to a write assist signal, the write assist circuit connects a selected one of the first and second cell supply lines to an associated one of the first and second threshold transistors, such that a cell supply voltage of the selected one of the first and second cell supply lines is reduced toward the threshold voltage of the associated one of the first and second threshold transistors; and
   control circuitry that selects the selected one of the first and second cell supply lines.

2. The static random access memory decoder circuit of claim 1, wherein said decoder is a two-column decoder.

3. The static random access memory decoder circuit of claim 1, wherein the control circuitry includes a first control transistor connected to the first cell supply line and a second control transistor connected to the second cell supply line.

4. The static random access memory decoder circuit of claim 1, wherein each of the first and second threshold transistors is coupled to a ground transistor enabled by the write-assist signal until the selected one of the first and second supply lines achieves the threshold voltage of the associated one of the first and second threshold transistors.

5. The static random access memory decoder circuit of claim 4, wherein when said first cell supply line is no greater than the first threshold voltage, the first threshold transistor disables the ground transistor and disconnects the first cell supply line from ground.

6. The static random access memory decoder circuit of claim 1, and further comprising:
   pull-up circuitry that selectively pulls up the first and second cells supply lines to a supply voltage responsive to the control circuitry.

7. A static random access memory, comprising:
   a memory array including a plurality of columns of memory cells including a first column and a second column;
   a row decoder coupled to the memory array;
   a plurality of sense amplifiers coupled to sense contents on the memory array; and
   a column decoder coupled to the memory array and including at least one multi-column decoder circuit in accordance with claim 1.

8. A method for providing write assistance to a static random access memory array via a multi-column decoder having a first cell supply line coupled to a first column of memory cells and a second cell supply line coupled to a second column of memory cells, said method comprising:
   selecting one of the first and second cell supply lines to supply a cell supply voltage to an associated one of the first and second columns of memory cells;
   enabling a threshold transistor to connect the selected one of the first and second cell supply lines to a ground transistor;
   in response to receiving an indication of a write operation to the static random access memory array, enabling the ground transistor to connect the selected one of the first and second cell supply lines to ground and to reduce the cell supply voltage toward a threshold voltage of the threshold transistor; and
   thereafter, disabling the threshold transistor to disconnect said selected one of the first and second cell supply lines from ground.

9. The method of claim 8, wherein the disabling comprises disabling the threshold transistor when the cell supply voltage reaches the threshold voltage of the threshold transistor.

10. The method of claim 8, and further comprising:
    in response to the selecting, pulling up a non-selected one of the first and second cell to a supply voltage.

11. A design structure embodied in a machine readable medium for designing, manufacturing, or testing an integrated circuit, the design structure comprising:
    a static random access memory decoder circuit including:
       a first cell supply line coupled to a first column of memory cells;
       a second cell supply line coupled to a second column of memory cells;
       a write assist circuit including a first threshold transistor coupled to the first cell supply line and a second threshold transistor coupled to the second cell supply line, wherein the first threshold transistor has a first threshold voltage level and the second threshold transistor has a second threshold voltage level, wherein in response to a write assist signal, the write assist circuit connects a selected one of the first and second cell supply lines to an associated one of the first and second threshold transistors, such that a cell supply voltage of the selected one of the first and second cell supply lines is reduced toward the threshold voltage of the associated one of the first and second threshold transistors; and control circuitry that selects the selected one of the first and second cell supply lines.

12. The design structure of claim 11, wherein each of the first and second threshold transistors is coupled to a ground transistor enabled by the write-assist signal until the selected one of the first and second cell supply lines achieves the threshold voltage of the associated one of the first and second threshold transistors.

13. The design structure of claim 12, wherein when said first cell supply line is no greater than the first threshold voltage, the first threshold transistor disables the ground transistor and disconnects the first cell supply line from ground.

14. The design structure of claim 11, and further comprising:
   pull-up circuitry that selectively pulls up the first and second cells supply lines to a supply voltage responsive to the control circuitry.

* * * * *